(12) United States Patent
Henrichs

(10) Patent No.: US 7,504,345 B2
(45) Date of Patent: Mar. 17, 2009

(54) METHOD FOR ELIMINATING DEFECTS FROM SEMICONDUCTOR MATERIALS

(75) Inventor: Joseph Reid Henrichs, Lees Summit, MO (US)

(73) Assignee: OPC Laser Systems LLC, Lees Summit, MO (US)

( * ) Notice: Subject to any disclaimer, the term of this patent is extended or adjusted under 35 U.S.C. 154(b) by 132 days.

(21) Appl. No.: 11/810,561

(22) Filed: Jun. 6, 2007

(65) Prior Publication Data

US 2008/0305560 A1 Dec. 11, 2008

(51) Int. Cl.
*H01L 21/00* (2006.01)

(52) U.S. Cl. .......................... 438/796; 438/4; 438/483; 438/795; 257/E21.211; 257/E21.324; 257/E21.326

(58) Field of Classification Search ................ 438/518, 438/572, 590; 257/E21.181, E21.182, E21.326, 257/E21.603
See application file for complete search history.

(56) References Cited

U.S. PATENT DOCUMENTS 6,056,857 A * 5/2000 Hunt et al. ............. 204/192.15

* cited by examiner

*Primary Examiner*—Walter L Lindsay, Jr.
*Assistant Examiner*—Cheung Lee

(57) ABSTRACT

Using a helium cryostat, the temperature for a substrate wafer(s) is reduced to 2.2 Kelvin over a period of twenty-four hours. Next, a soak segment will hold the temperature of the substrate wafer at 2.2 Kelvin for a period of ninety-six hours. At these low temperatures, alloys such as GaAs, InP, and GaP will form dipole molecular moments, which will re-align along lines of internal magnetic force as molecular bonds condense. Next the substrate wafer's temperature is ramped up to room temperature over a period of twenty-four hours. Next, the temperature of the substrate wafer is ramped up to assure that the temperature gradients made to occur within the wafer are kept low. Next, the substrate wafer undergoes a temper hold segment, which assures that the entire substrate wafer has had the benefit of the tempering temperature.

1 Claim, 6 Drawing Sheets

Prior-Art

METHOD FOR ELIMINATING DEFECTS FROM SEMICONDUCTOR MATERIALS

CROSS-REFERENCE TO RELATED APPLICATIONS

Not Applicable

STATEMENT REGARDING FEDERALLY SPONSORED RESERACH OR DEVELOPMENT

Not Applicable

INCORPORATION-BY-REFERENCE OF MATERIAL SUBMITTED ON A COMPACT DISC

Not Applicable

REFERENCE TO A MICROFICHE APPENDIX

Not Applicable

BACKGROUND OF THE INVENTION

1. Field of the Invention

This invention relates generally to a method for eliminating defects from semiconductor material, and more specifically to the cryogenic treatment of semiconductor materials, e.g. "Indium-Phosphide" (InP), "Gallium-Arsenide" (GaAs), "Gallium-Nitride" (GaN), and "Gallium-Phosphide" (GaP), semiconductor ingots, semiconductor substrate wafers, and epitaxially grown semiconductor layers and other structures as the means to provide for the elimination of dislocation and other defects from said material and structures.

2. Description of Related Art

The invention generally relates to processes currently used to reduce the number of defects that form in large single crystals, and more particularly to processes used to grow defect free large single crystals of Group III-V semiconductor compounds. One of the most significant developments in recent years in semiconductor technology has been the increased importance of compound semiconductors. Particularly significant are the Group III-V semiconductor compounds composed of elements of Groups III and V of the periodic table, such as GaAs and InP. Compound semiconductors, such as InP are currently used in devices such as semiconductor "Laser Diodes" (LDs), "Light Emitting Diodes" (LEDs), microwave oscillators and amplifiers, high-speed transistors, e.g. "High Electron Mobility Transistors" (HEMT), and various types of radiation detectors including infrared and visible light detectors.

Because a higher electron drift velocity makes possible faster switching speeds over the more conventional devices constructed using silicon, GaAs is increasingly being used for integrated memory and logic circuitries. The commercial use of semiconductors requires the growth of large single crystals of defect free semiconductor material.

Various methods have been proposed for growing large single crystal ingots from which defect free substrate wafers can be cut for the subsequent fabrication of useful electronic and electro-optic devices. One of the more promising methods for such crystal growth is the "Vertical Gradient Freeze" (VGF) method, particularly the VGF method defined in the W. A. Gault U.S. Pat. No. 4,404,172. According to this method, polycrystalline starting construction material is placed in a vertically extending crucible including a small cylindrical seed-well portion at its bottom end, which snugly contains a seed-crystal. Initially, the starting material and a portion of the seed are melted. The power to the system is then reduced in such a manner that freezing proceeds vertically upwardly from the seed-crystal.

The major advantage of the VGF method over more conventional methods, such as the Czochralski growth method, is that morphous single crystal melts with very 'low dislocation densities' (i.e., a reduction in defect density) can be produced using low thermal gradients and slow rates of cooling. However, because the interaction of the melt with the crucible normally leads to the introduction of dislocations that cause false grains to nucleate and spoil portions of the single crystal the VGF method has its limitations.

Further, it is well known that the III-V compounds tend to dissociate at higher temperatures, with the more volatile Group V elements escaping into the vapor phase. Several approaches have been developed to prevent or retard this tendency. For example, in one approach to the growth of GaAs crystals, the more volatile Arsenic component is prevented from escaping by providing a vapor pressure of Arsenic vapor over the melt from a separately heated reservoir of Arsenic within the sealed growth container.

Moreover, it is also known in the art that Arsenic loss from the melt may be retarded with the use of any of various materials such as "Boric-Oxide" ($B_2O_3$), "Barium-Chloride" ($BaCl_2$), or "Calcium-Chloride" ($CaCl_2$), which act as diffusion barriers. Such additives, having a lower density than the molten GaAs, rise to the surface, encapsulate the melt, and together with an inert gas pressure in the vessel, can contain the volatile Arsenic vapors; e.g., see the paper "Growth of Single Crystals of GaAs in Bulk and Thin Film Form," by B. A. Joyce, included in the book "Crystal Growth," edited by B. R. Pamplin, Pergamon Press, 1975, pp. 157-184 at page 165.

Furthermore, various attempts have been made over the years to grow III-V crystals by the VGF technique utilizing different crucible materials. For example, see the aforementioned Pamplin book at pp. 389-391. A significant limitation on the success of these efforts has been the physical and chemical interaction of the melt with the crucible wall. For example, see the aforementioned Pamplin book, at p. 389, and "The Art and Science of Growing Crystals," by J. J. Gilman, Ed., John Wiley & Sons, New York, 1963, at p. 366 and p. 390.

FIG. 1 illustrates an apparatus that has been used for the selective growth of the boric oxide layer in accordance with the prior-art. Crucible 11 is contained within a cylinder 10, which in turn is contained within a furnace 13. As the furnace heats the crucible, oxygen ($O_2$) is introduced into the interior of the crucible by a tubulation 14. Simultaneously, a counterflow of inert gas, such as nitrogen ($N_2$), is introduced into cylinder 10. The nitrogen thus enters the open end of the seed-well portion of the crucible 11 so as to prevent oxygen from entering from the opposite end. Thus, both oxygen and nitrogen are expelled at the same end of the cylinder 10 as shown by the arrows that designate gas flow.

By simple experimentation, one can quickly obtain a placement of tubulation 14 that, with an appropriate flow of nitrogen, gives thermal oxidation of the frusto-conical transition portion without oxidizing the inner surface of the seed-well portion of the crucible 11. The flow of nitrogen in cylinder 10 along the outer surface of crucible 11 prevents oxide growth on the outer surface of the crucible. For growth of a boric oxide layer 15-µm thick, the crucible was heated at 1050° Celcius for 18 hours, while being exposed to $O_2$ flowing at a rate of 40 liters per hour (1/hr).

During growth of layer 12, the structures are preferably arranged in an axially symmetric environment (FIG. 2), to enhance uniformity. Nevertheless, it has been found that eddy currents of nitrogen sometimes occur around the large open end of the major portion of the crucible so as to reduce the thickness of the layer 12 at that end. It has proved difficult to reproducibly decouple this interaction in order to eliminate spurious polycrystalline growth. In conclusion, while the VGF method has succeeded in eliminating some dislocation defects in III-V comprised crystals, as described above, it clearly has its limitations—the most significant being higher manufacturing costs.

BRIEF SUMMARY OF THE INVENTION

In accordance with the present invention a method and apparatus that uses cryogenics as the means to eliminate defects, such as dislocations from large single crystals, monocrystal substrate wafers, epilayers, and other structures comprising material taken from columns III and V of the periodic table of elements.

Objects and Advantages

Accordingly, besides the objects and advantages of the cryogenic method described in my above patent, several objects and advantages of the present invention are:

(a) to provide for large single crystals of column III-V compounds that have little or no dislocation defects;

(b) to provide a lower cost of manufacturing for large dislocation free single crystals of column III-V compounds;

(c) to provide a much larger wafer size (e.g., 10- to 12-in in diameter) for large dislocation free single crystals of column III-V compounds;

(d) to provide a very high yield of coherent microstructures formed in dislocation free wafers and epilayers comprising column III-V compounds;

(e) to provide a very high yield for integrated HEMT configured memory and logic circuitry per wafer;

(f) to provide a much lower failure rate for integrated HEMT configured memory and logic circuitry per wafer;

(g) to provide for large single crystals of column III-V compounds that have little or no point defects;

(h) to provide a much lower degree of power consumption for integrated memory and logic circuitry.

Further objects and advantages will become apparent from a consideration of the ensuing description and drawings. The effect cryogenic processing has on non-ferrous materials will be useful in overcoming some of the everyday issues that engineers face when working with these materials, especially in applications that require high levels of accuracy.

Moreover, deep cryogenic processing (i.e., having a temperature range between −273° to −195° Celsius) of materials, such as InP, GaAs, InAs, GaP, InGaN, GaN, Ge, Si, and other non-ferrous (i.e., non-magnetic) metals, can be a great benefit, simply because these materials, during high-temperature growth and/or deposition, solidify before they are able to form more uniform crystalline structure. This sets up 'stress' areas that cause defects (e.g., dislocation defects) to form within the material's crystalline lattice.

In addition, other defects, such as point defects (e.g., vacancies) also occur during the non-uniform crystallization of these materials. Regardless, by applying a post-production deep cryogenic process to these paramagnetic and diamagnetic materials, we can reorganise their molecules into uniform structures, which have more tightened atomic bonds and so alleviate the vast majority of the previously described defect problems. Cryogenic processing has the added benefit of being able to change the electrical characteristics of these materials. By providing for an enhanced molecular uniformity, electrons are allowed to flow more freely; thus, providing for a more efficient, cooler running, integrated electro-optic and/or electronic component.

BRIEF DESCRIPTION OF THE SEVERAL VIEWS OF THE DRAWINGS

Still further objects and advantages will become more apparent from a consideration of the ensuing figure descriptions and drawings. In the drawings, closely related figures have the same number but different alphabetic suffixes.

DESCRIPTION OF THE INVENTION

Figure 1:
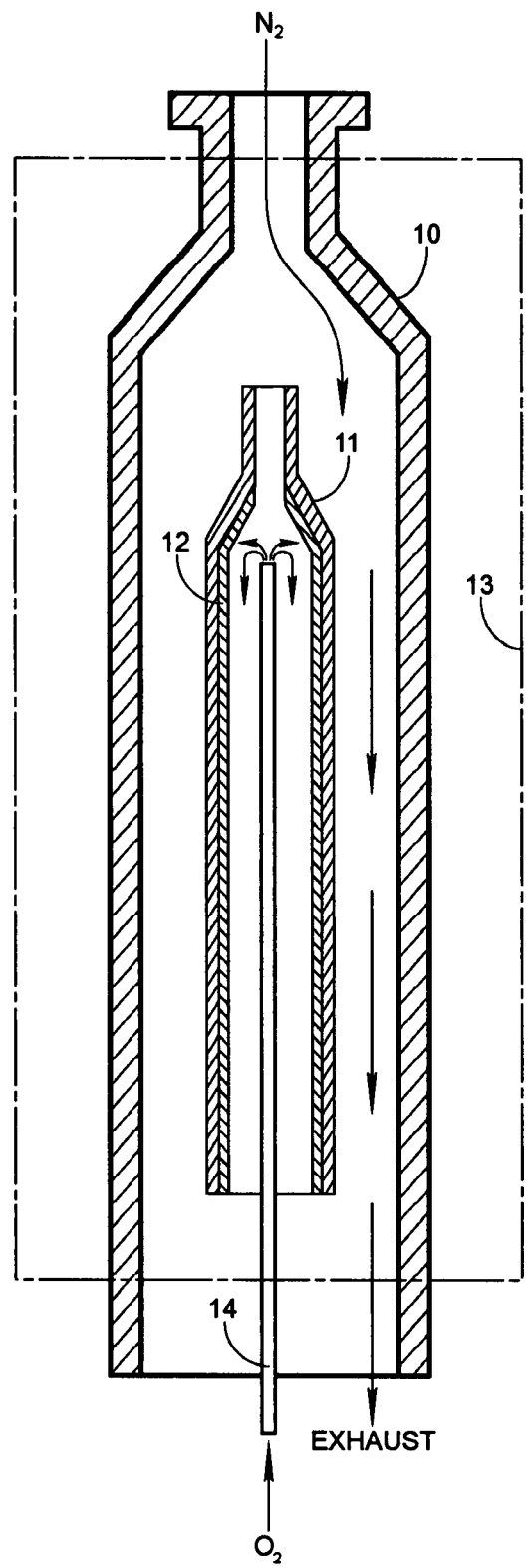
FIG. 1 illustrates a prior-art vertical gradient freeze fabrication method and apparatus used for growing large defect free single crystals of material taken from columns III and V of the periodic table of elements.
Figure 2:
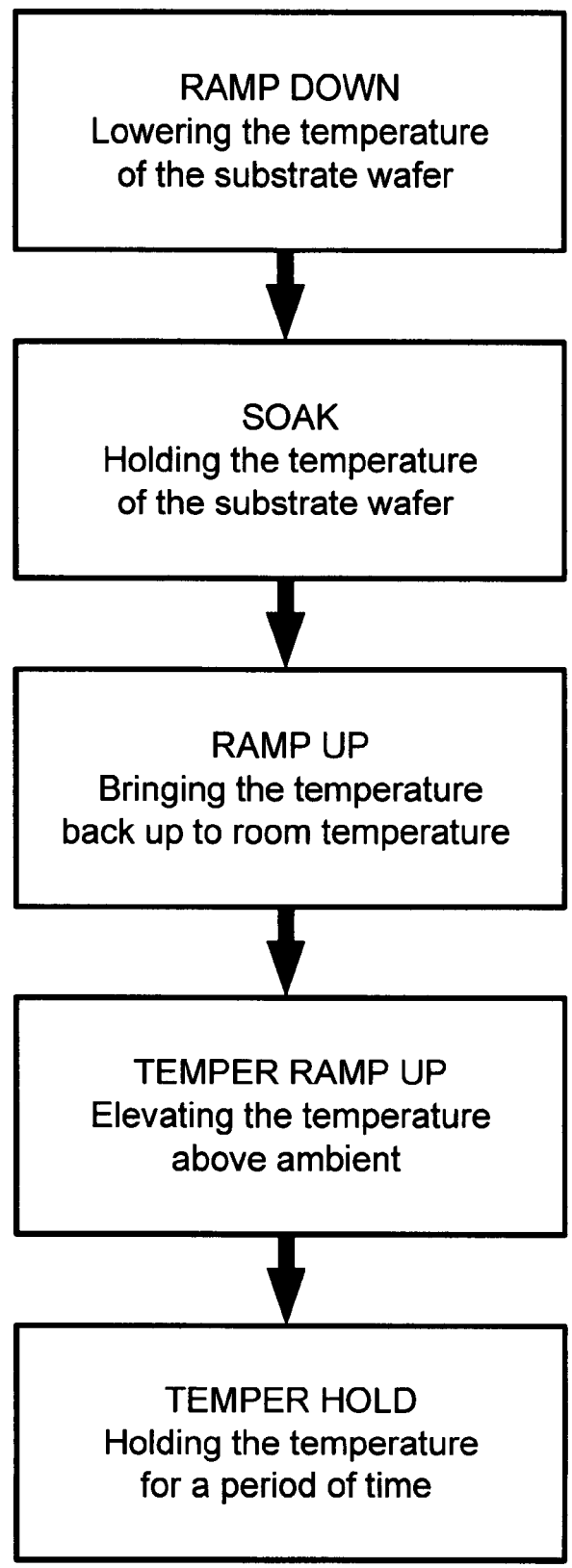
FIG. 2 is a block diagram that illustrates the preferred method for the deep cryogenic treatment of substrate wafers constructed from single crystal material from columns III and V of the periodic table of elements as the means to remove dislocation and other defects from the substrate wafer.

FIG. 2—Preferred Embodiment

The preferred embodiment of the cryogenic method of the present invention as diagramed in FIG. 2 comprises a cryogenic cycle that consists of:

a. RAMP DOWN—Lowering the temperature of the substrate wafer;

b. SOAK—Holding the temperature of the substrate wafer;

c. RAMP UP—Bringing the temperature back up to room temperature;

e. TEMPER RAMP UP—Elevating the temperature to above ambient;

f. TEMPER HOLD—Holding the elevated temperature for a time.

The preferred embodiment of my invention will use a helium cryostat, because the liquid helium the cryostat uses is chemically inert and will not react with any of the single crystal materials being processed. In addition, liquid helium will provide much lower temperatures (i.e., 2.17K) over the low temperatures provided by liquid nitrogen (i.e., 77K); liquid nitrogen could be used instead of the preferred liquid helium. A typical cryogenic cycle of the preferred embodiment of my invention will bring the temperature of the substrate wafer down to 2.2K over a period of twenty-four hours. This will avoid thermally shocking the substrate wafer(s). There is ample reason for the slow ramp down. Think in terms of dropping a cannon ball into a vat of liquid helium.

The outside of the cannon ball would want to become the same temperature as the liquid helium, which is near 2.2K. While the inside would want to remain at room temperature. This sets up a temperature gradient that is very steep in the first moments of exposure to the liquid helium. The area that is cold wants to contract to the size it would be if it were as cold as the liquid helium. While, the inside wants to stay the same size it was when it was room temperature. This can set up enormous stresses in the surface of the substrate wafer, which can lead to cracking at the surface. Some alloys can take the sudden temperature change, but most of the metal alloys taken from columns III-V will not as their disassociation temperatures are normally very high.

A typical soak segment will hold the temperature at 2.2 Kelvin for some period of time, in the case of my invention a period of ninety-six hours. During the soak segment of the process the temperature is maintained at the low temperature of 2.2K. Although molecular bond lengths are shortening within the single crystal structure of the single crystal alloy at this temperature, the change made to bond lengths is a relatively slow process and requires time to occur. The result is the precipitation of a much finer, more uniform, molecular structure for the alloy. In addition, at these low temperatures, alloys such as GaAs, InP, and GaP form dipole moments, which will re-align along lines of internal magnetic force as their bonds condense. I believe that this greater than normal amount of time in the soak process also provides time for the crystalline structure to react at the quantum level to the lower temperature, and will allow for much greater amounts of vibrational energy to leave the molecules that comprise the substrate wafer.

In theory a perfect crystal lattice structure is possible at its lowest energy state; i.e., when the vibrational energy in the $\upsilon=0$ state is $E_{vib}=hf/2$. Moreover, by keeping the substrate wafer at a low temperature of 2.2K for a longer period, we will get more of the energy out of the lattice; consequently making a more perfect and therefore, stronger, lower defect crystalline structure.

A typical ramp up segment brings the temperature back up to room temperature. In the case of my invention, this will typically be a period of twenty-four hours. The ramp up cycle is very important to the process. Ramping up too fast can cause problems with the substrate wafer being treated. Think in terms of dropping an ice cube into a glass of warm water. The ice cube would crack. The same would happen to the substrate wafer(s) being processed.

A typical temper segment ramps the temperature up over a predetermined period of time. This is done by using the same type of tempering process as the quench and temper cycle used in a heat-treat annealing process. We ramp up the temperature to assure the temperature gradients within the substrate wafer are kept low. Typically, tempering temperatures are between 300 F on up to 1100 F, depending on the single crystal material the substrate wafer is constructed from. The temper hold segment assures the entire substrate wafer has had the benefit of the tempering temperature. A typical temper hold time is about 3 hours. This time depends on the material, thickness, and diameter size of the substrate wafer.

Figure 3:
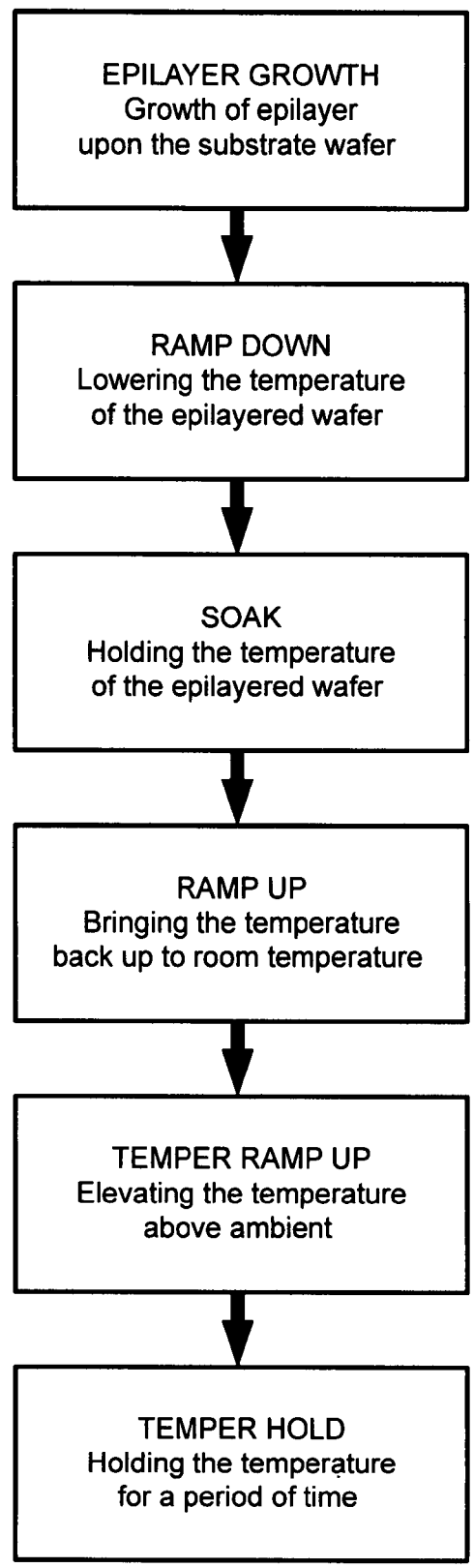
FIG. 3 is a block diagram that illustrates the additional method of the deep cryogenic treatment of epilayers grown upon substrate wafers constructed from single crystal material from columns III and V of the periodic table of elements as the means to remove dislocation and other defects from the epilayers.

FIG. 3—Additional Embobiment

An additional embodiment of the deep cryogenic method of my present invention, as diagramed in FIG. 3, comprises a cryogenic cycle that consists of:
 a. The growth of an epilayer (e.g., a buffer layer) upon a substrate wafer using an epitaxial growth method, e.g. such as "Metal Oxide Chemical Vapor Deposition" (MOCVD) or "Molecular Beam Epitaxy" (MBE).
 b. RAMP DOWN—Lowering the temperature of the epilayered wafer.
 c. SOAK—Holding the temperature of the epilayered wafer.
 d. RAMP UP—Bringing the temperature back up to room temperature.
 e. TEMPER RAMP UP—Elevating the temperature to above ambient.
 f. TEMPER HOLD—Holding the elevated temperature for a period.

A typical cryogenic cycle for the additional embodiment of my invention will bring the temperature of the epilayered substrate wafer down to 2.2K over a period of twenty-four hours. This will avoid thermally shocking the epilayered substrate wafer(s).

A typical soak segment will hold the temperature at 2.2 K for a period of ninety-six hours. During the soak segment of the process the temperature is maintained at 2.2 Kelvin. Although molecular bonds are changing within the crystal structure of the epilayered substrate wafer at this temperature, these changes are relatively slow and need time to occur. One of the changes is the precipitation of a much finer, more uniform, molecular structure. I believe that this greater than normal amount of time in the soak process will provide more time for the single crystal bonds to condense further as greater amounts of vibrational energy is removed from the single crystal epilayer(s) and substrate wafer(s).

A typical ramp up segment brings the temperature of the epilayered substrate wafer back up to room temperature. In the case of the additional embodiment of my invention, this can typically take twenty-four hours. The ramp up cycle is very important to the process. Ramping up too fast can cause problems with the epilayered substrate wafer(s) being treated. A typical temper segment ramps the temperature up to a predetermined level over a period of time. This is done by using the same type of tempering process as is used in the 'quench and temper cycle' used in heat-treat annealing.

We ramp up the temperature to assure the temperature gradients within the epilayered substrate wafer(s) are kept low. Tempering temperatures can range from 300° to 1100° Fahrenheit; depending upon single crystal material, the epilayers and substrate wafers are constructed from. The temper hold segment assures that the epilayered substrate wafer(s) have had the benefit of the tempering temperature. A typical temper hold period is about 3 hours. This time period depends on the thickness and diameter size of the epilayered substrate wafer(s).

Figure 4:
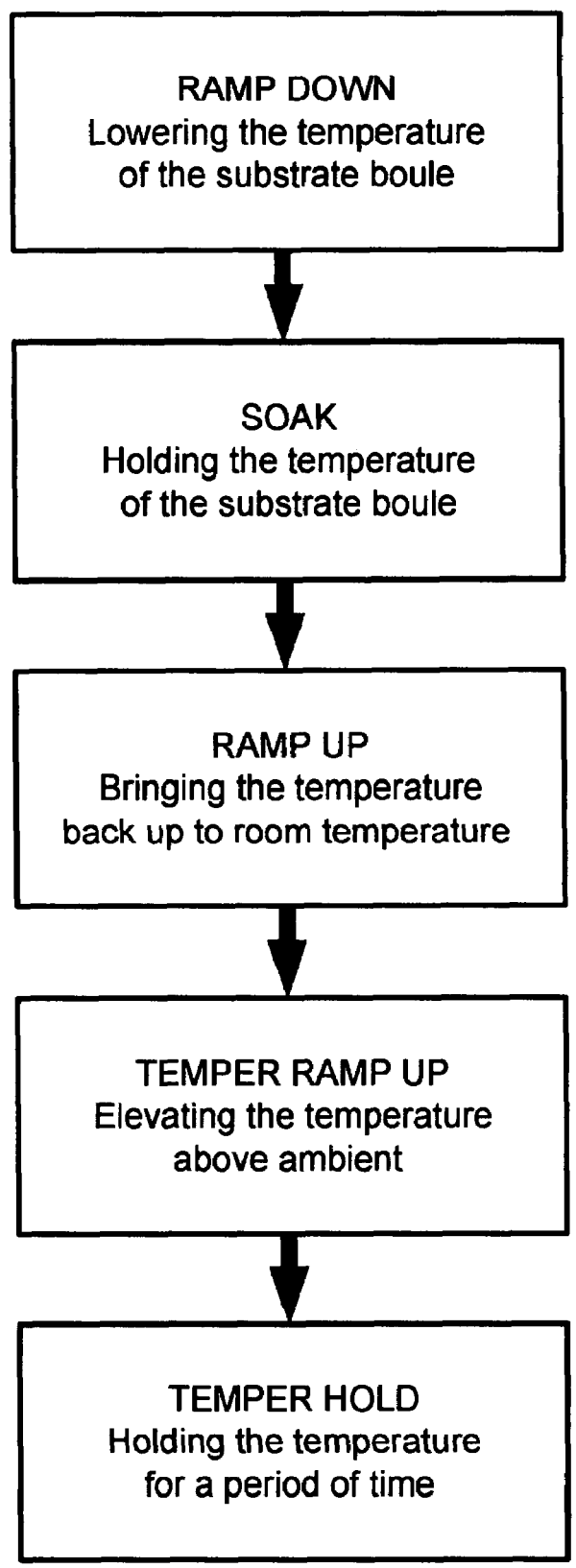
FIG. 4 is a block diagram that illustrates the first alternative method of deep cryogenic treatment of single crystal boules formed using material taken from columns III and V of the periodic table of elements as the means to remove dislocation and other defects from the boule(s).
Figure 5:
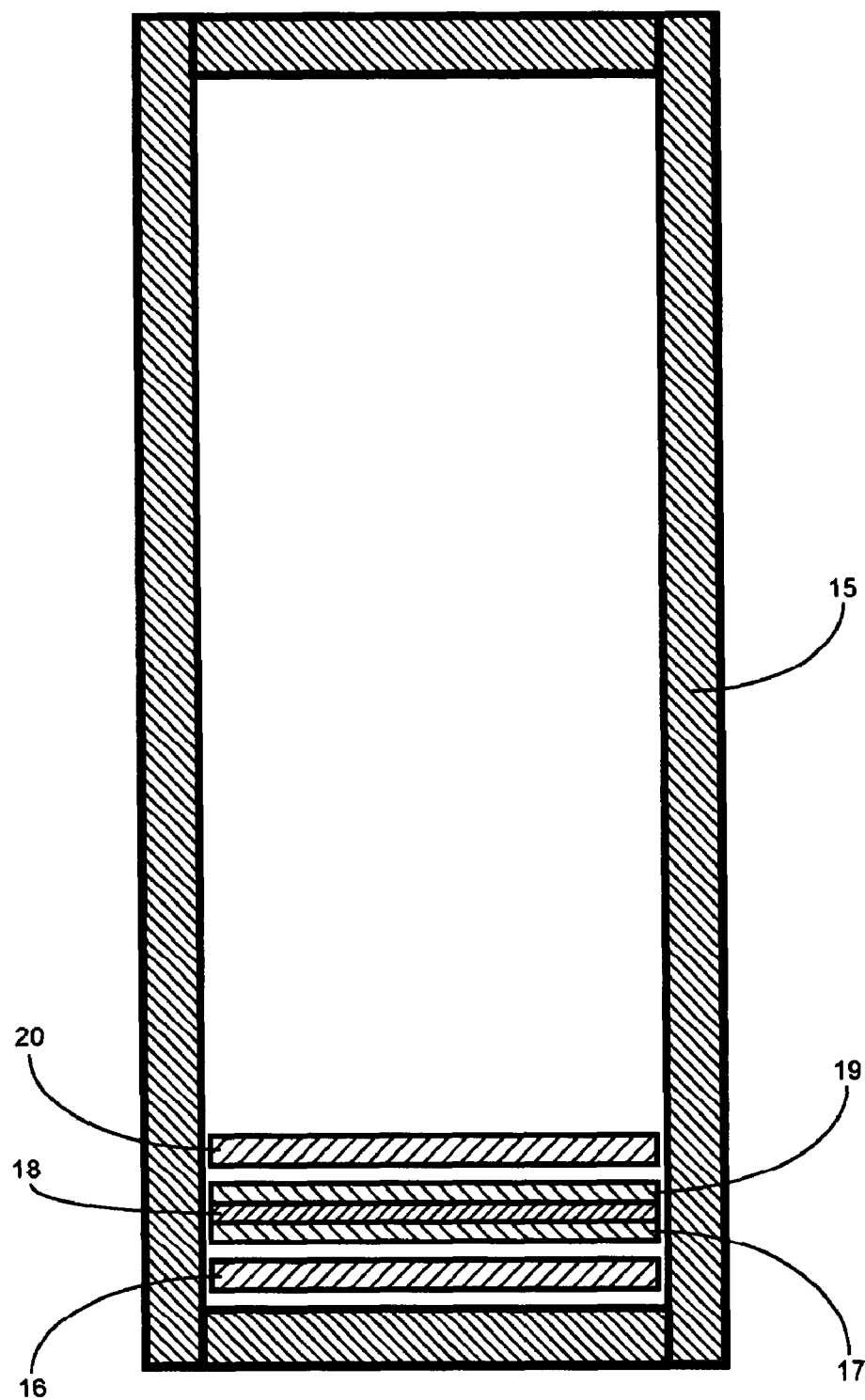
FIG. 5 is a section side-view drawing of the capsule used in the second alternative method of the deep cryogenic treatment of substrate wafer(s) constructed from single crystal material taken from columns III and V of the periodic table of elements.
Figure 6:
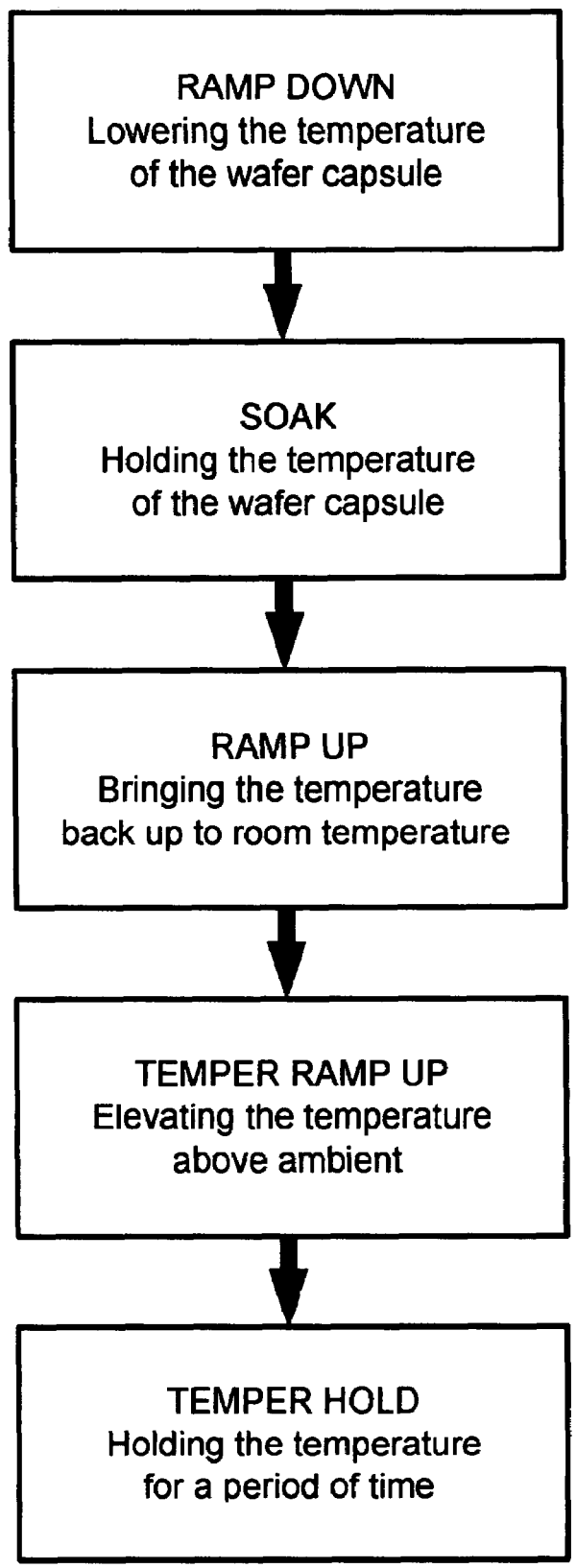
FIG. 6 is a block diagram that illustrates the second alternative method of the deep cryogenic treatment of substrate wafer(s) constructed from single crystal material taken from columns III and V of the periodic table of elements, which uses a capsule to provide for a high-flux magnetic field as the means to promote greater molecular uniformity in the substrate wafer(s) contained within the capsule.

FIGS. 4, 5, and 6—Alternative Embodiments

The first alternative embodiment of the deep cryogenic method of my present invention, as diagramed in FIG. 4, comprises a cryogenic cycle that consists of:
 a. RAMP DOWN—Lowering the temperature of the substrate boule.
 b. SOAK—Holding the temperature of the substrate boule.
 c. RAMP UP—Bringing the temperature back up to room temperature.

d. TEMPER RAMP UP—Elevating the temperature to above ambient.
e. TEMPER HOLD—Holding the elevated temperature for a period.

A typical cryogenic cycle for the first alternative embodiment of my invention brings the temperature of the substrate wafer boule down to 2.2 Kelvin over a period of twenty-four hours. This will avoid thermally shocking the substrate wafer boule(s).

A typical soak segment will hold the temperature at 2.2 K for a period of ninety-six hours. During the soak segment of the process the temperature is maintained at 2.2 Kelvin. Although molecular bonds are condensing within the crystal structure of the substrate wafer boule at this temperature, these changes are a relatively slow process and need time to occur. One of the changes is the precipitation of a much finer, more uniform, molecular structure. I believe that this greater than normal amount of time in the soak process will provide more time for the molecular bonds to condense even further as greater amounts of vibrational energy is removed from the substrate wafer boule(s).

A typical ramp up segment brings the temperature of the substrate wafer boule(s) back up to room temperature. In the case of the first alternative embodiment of the invention, this can take twenty-four hours. The ramp up cycle is very important to the process. Ramping up too fast can cause problems with the substrate wafer boule(s) being treated. A typical temper segment ramps the temperature up to a predetermined level over a period of time. This is done by using the same type of tempering process as is used in the 'quench and temper cycle' used in heat-treat annealing.

We ramp up the temperature to assure the temperature gradients within the substrate wafer boule(s) are kept low. Tempering temperatures can range from 300° to 1100° Fahrenheit; depending upon single crystal material, the substrate wafer boule(s) are constructed from. The temper hold segment assures that the substrate wafer boule(s) have had the benefit of the tempering temperature. A typical temper hold period is about 3 hours. This time period depends on the length and diameter size of the substrate wafer boule(s).

The second alternative embodiment of the deep cryogenic method of my present invention, as illustrated in FIG. 5, uses a wafer holding capsule apparatus, which comprises a plastic tube 15 having an inner-wall diameter size slightly larger than the substrate wafer 18. At the bottom of tube 15 is placed a first high-flux disk shaped magnet 16. Next, a first disk of Pyrolytic Carbon 17 having the same diameter size as the first magnet 16 is placed into the tube shaped capsule 15 above the first magnet 16. Next, the substrate wafer 18 is placed upon the first Pyrolytic Carbon disk 17. Next, a second Pyrolytic Carbon disk 19, having the same diameter size as the first Pyrolytic Carbon disk 17, is placed into the plastic tube 15, above the substrate wafer 18. Next, a second high-flux disk shaped magnet 20 is placed into the tube shaped capsule 15, located above the second Pyrolytic Carbon disk 19; moreover, the order of material/magnet segments can be repeated for a multitude of substrate wafers.

Next, as diagramed in FIG. 6, the plastic tube shaped capsule 15 is sealed and then placed into a helium capable cryoprocessor, where it will undergo a cryogenic cycle that consists of:

a. RAMP DOWN—Lowering the temperature of the wafer capsule.
b. SOAK—Holding the temperature of the wafer capsule.
c. RAMP UP—Bringing the temperature back up to room temperature.
d. TEMPER RAMP UP—Elevating the temperature to above ambient.
e. TEMPER RAMP UP—Elevating the temperature to above ambient.
f. TEMPER HOLD—Holding the elevated temperature for a period.

A typical cryogenic cycle for the first alternative embodiment of my present invention begins by ramping down the temperature of the wafer capsule 15 to 2.2 Kelvin over a period of twenty-four hours. This will avoid thermally shocking the substrate wafer(s) 18 contained within the wafer capsule(s) 15. Typically, the soak segment will hold the temperature of the wafer capsule 15 at 2.2 Kelvin for a pre-determined period, in the case of the first alternative embodiment of my invention, the soak period will equal ninety-six hours. During the soak segment of the process the temperature is maintained at the low temperature of 2.2 Kelvin.

Although the bond lengths are condensing within the crystal structure of the substrate wafer(s) 18 at this temperature, the changes in bond lengths change at a relatively slow rate and need time to occur. One of the changes is the precipitation of a much finer, more uniform, molecular structure for the substrate wafer(s) 18. As cryogenic temperatures are reached for the substrate wafer capsule(s) 15, there will be an increase in the molecular alignment for the dipoles moments that will form in the substrate wafer(s) 18 as the direct result of having high-flux magnet disks 16 and 20 being present within the substrate wafer capsule(s) 15. I believe that this greater than normal amount of time for the soak process will provide more time for the single crystal bonds to condense even further as greater amounts of vibrational energy is removed from the single crystal substrate wafer(s) 18 present within the substrate wafer capsule(s) 15.

A typical ramp up segment brings the temperature back up to room temperature. In the case of the first alternative invention this can take about twenty-four hours. The ramp up cycle is very important to the process. Ramping up too fast can cause problems for the substrate wafer(s) 18 being treated. A typical temper segment ramps the temperature up to a predetermined level over a predetermined period. This is done by using the same type of tempering process as is used in a quench and temper cycle in a heat-treat annealing process.

Before the ramp up process can proceed the substrate wafer(s) 18 are removed from the wafer capsule(s) 15 and placed into a furnace like the one described in the document entitled "Vertical Access Zero Boiloff Rampable Superconducting Magnet System with Horizontal Field for Semiconductor Crystal Growth," written by H. B. Jin, S. J. Choi, H. J. Kim, H. H. Han, B. S. Park, B. G. Lee, K. D. Sim, Y. K. Kwon, C. H. Winter, and D. Healey, and published in the proceedings of the 2002 Applied Superconductivity Conference held in Houston, Tex.

Using a furnace equipped with a superconducting magnet, we ramp up the temperature to assure the temperature gradients within the single crystal substrate wafer(s) 18, while the high magnetic field strengths provided by the superconducting magnet is used to maintain molecular alignment during the ramp up annealing process. Tempering temperatures will range from 300° F. to 1100° F.; depending upon the single crystal material used to construct the substrate wafer(s) 18.

In addition, the temper hold segment assures that the entire substrate wafer(s) 18 has had the benefit of the tempering temperature. A typical temper hold time is about 3 hours, where the hold time period depends upon the thickness and diameter size of the substrate wafer(s) 18.

Advantages

From the above paragraphs, which describe the additional and alternative embodiments of my invention, several objects and advantages of the present invention are made apparent as:

(a) to provide for epilayers and epilayered substrate wafer(s) comprising column III-V compounds that are free from point, dislocation, and other defects;

(b) to provide for larger diameter sizes (e.g., 10- to 12-inches) for single crystal boules of column III-V compounds that are free from point, dislocation, and other defects;

(c) to provide for an apparatus and method that is used to enhance the degree of molecular alignment made to occur for a single crystal substrate wafer(s) formed using column III-V compounds as construction material.

Operation

In order to understand the operation of my invention it's important to know a few facts regarding single crystal materials and their defects; e.g., single crystal materials typically have a very regular atomic structure—that is, the local positions of their atoms with respect to each other are repeated at the atomic scale. The structural arrangements of these atoms are normally called crystal lattice structures, and their study is called crystallography.

However, single crystal materials are not perfect—that is, the regular pattern of atomic arrangement is interrupted by crystal defects. Larger defects in an ordered structure are usually considered dislocation loops. Non-uniform molecular structure (i.e., crystallographic defects) normally forms as the result of high-temperature crystallographic growth and/or deposition.

In materials science, a dislocation is a crystallographic defect, or irregularity, within a crystal lattice structure. The presence of dislocations strongly influences many of the electronic and modulus properties of real crystal materials. Modern crystallography dislocation theory was originally developed by Vito Volterra in 1905. In it Volterra explains that dislocations can be visualised as being caused by the termination of a plane of atoms in the middle of a crystal lattice. In such a case, the surrounding planes are not straight, but instead bend around the edge of the terminating plane so that the crystal structure is perfectly ordered on either side. The analogy used is that of a stack of paper; wherein, half a piece of paper is located in the stack of paper, and that the defect in the stack is only noticeable at the edge of the half sheet.

Further, there are two primary types of dislocation crystallographic defects: 1.) the edge-dislocation and 2.) the screw-dislocation, with mixed dislocations (i.e., equally comprising of both edge and screw dislocations) being intermediate between these. Mathematically, dislocations are a type of topological defect, sometimes called a soliton by those versed in the art.

Mathematical theory further explains why dislocations behave as stable particles—that is to say, they can be moved about, while maintaining their identity as they move. When two dislocations of opposite orientation are brought together they can cancel each other (this is known as the process of annihilation); moreover, there is no way a single dislocation can 'disappear' on its own.

Furthermore, a dislocation can be visualized by cutting a crystal along a plane and slipping one half across the other by a lattice vector. The halves will fit back together without leaving a defect. But if the cut only goes part way though the crystal, the boundary of the cut will leave a defect, distorting the nearby lattice. This boundary is the line of the dislocation; the direction of the slip is called the Burgers vector. Dislocations are normally labeled by the angle between the dislocation line and the Burgers vector. The special cases of 90° and 0° are known as edge and screw dislocations.

Further, the dislocations present in real crystalline solids are generally mixed rather than edge or screw; thus, the actual angles of dislocations depend on the lattice structure of the crystal. The Burgers vector for an edge dislocation is perpendicular to the dislocation line in the case of the edge, and parallel to it in the case of the screw. In metallic materials, the Burgers vector is aligned with close-packed crystallographic directions and its magnitude is equivalent to one interatomic spacing.

Alternatively, edge dislocations can be visualised as being formed by adding an extra half-plane of atoms to a perfect crystal, so that a defect is created in the regular crystal structure along the line where the extra half-plane ends. Such visualisations can be difficult to interpret. Initially, it can be helpful to follow the process of simplification involved in arriving at such representations.

One approach is to begin by considering a 3-d representation of a perfect crystal lattice, with the atoms represented by spheres. Further, the viewer may then start to simplify the representation by visualising planes of atoms instead of the atoms themselves. Moreover, the stresses caused by an edge dislocation are complex due to its inherent asymmetry and is described by three equations, which are shown below as $$\sigma_{xx} = \frac{-\mu b}{2\pi(1-v)} \frac{y(3x^2 + y^2)}{(x^2 + y^2)^2}$$

$$\sigma_{yy} = \frac{-\mu b}{2\pi(1-v)} \frac{y(x^2 - y^2)}{(x^2 + y^2)^2}$$

$$\tau_{xy} = \frac{-\mu b}{2\pi(1-v)} \frac{x(x^2 - y^2)}{(x^2 + y^2)^2}$$

where $\mu$ is the shear modulus of the material, b is the Burgers vector, v is Poisson's ratio and x and y are coordinates. These equations suggest a vertically oriented dumbbell of stresses surrounding the dislocation, with compression experienced by the atoms near the 'extra' plane, and tension experienced by those atoms near the 'missing' plane.

Screw dislocations are more difficult to visualize, but can be considered as being formed by the insertion of a 'parking garage ramp' structure that extends to the 'edges of the garage' into an otherwise perfectly layered structure. Basically it comprises a structure in which a helical path is traced around the linear defect (i.e., the dislocation line) by the atomic planes in the crystal lattice. Despite the difficulty in visualization, the stresses caused by a screw dislocation are less complex than those of an edge dislocation. These stresses need only one equation, as symmetry allows only one radial coordinate to be used, which is shown below as $$\tau_r = \frac{-\mu b}{2\pi r}$$

where $\mu$ is the shear modulus of the material, b is the Burgers vector, and r is a radial coordinate. This equation suggests a long cylinder of stress radiating outward from the cylinder and decreasing with distance. Please note, this simple model results in an infinite value for the core of the dislocation at r=0 and so it is only valid for stresses outside of the core of the dislocation.

When a dislocation line intersects the surface of a metallic material (e.g., GaAs, InP, InAs, GaP, and/or GaN), the associated strain field locally increases the relative susceptibility of the material to etching and an etch pit of regular geometrical format results. This explains why the production (e.g., coherent structures formed in these materials using grey-scale lithography) of coherent microscopic structure is problematic for single crystal materials such as GaAs. If the material is strained (i.e., deformed) and repeatedly re-etched, a series of etch pits can be produced, which can effectively trace the movement of the dislocation in question.

Transmission electron microscopy can also be used to observe dislocations within the microstructure of single crystal materials. Whereby, thin foils of metallic samples are prepared to render them transparent to the electron beam of the microscope. The electron beam suffers diffraction by the regular crystal lattice planes of the metal atoms and the differing relative angles between the beam and the lattice planes of each grain located in the metal's microstructure result in image contrast (i.e., contrasts that occurs between grains of different crystallographic orientation). The less regular atomic structures of the grain boundaries and in the strain fields around dislocation lines have different diffractive properties than the regular lattice lines occurring within the grains and therefore, present different contrast effects in the electron micrographs. Dislocations are normally seen as dark lines in the lighter, central, region of a micrograph.

Transmission electron micrographs of dislocations typically utilize magnifications of 50,000 to 300,000 times (though the equipment itself offers a wider range of magnifications than this). Some microscopes also permit the in-situ heating and/or deformation of samples; thereby, permitting the direct observation of dislocation movement and their interactions. Please note that the characteristic image contrast exhibited by dislocation lines as they pass through the thickness of the material is 'wiggly' in form. Further note that a dislocation cannot end within a crystal; thus, a dislocation can only be contained within a crystal as a complete loop.

Additionally, 'field ion microscopy' and 'atom probe' techniques offer methods of producing much higher magnifications (i.e., typically 3 million times and above) and permit the observation of dislocations at an atomic level. Where surface relief can be resolved to the level of an atomic step, screw dislocations appear as distinctive spiral features; thus, revealing an important mechanism of crystal growth, where there is a surface step, atoms can more easily add to the crystal, and the surface step associated with a screw dislocation is never destroyed no matter how many atoms are added.

By contrast, traditional optical microscopy, which is not appropriate for the observation of dislocations, because it typically offers magnifications up to a maximum of only around 2000 times. After chemical etching, small pits are formed, where the etching solution preferentially attacks the more highly strained material around the dislocations. Thus, the image features indicate points at which dislocations intercept the sample surface. In this way, dislocations in silicon, for example, can be observed indirectly using an interference microscope, where crystal orientation can be determined by the shape of the dislocation observed (e.g., 100—being elliptical, and 111—being pyramidal).

In addition, dislocation density in a material can be increased via plastic deformation by the following relationship $$\tau \alpha \rho^{1/2}.$$

Since the dislocation density increases with plastic deformation, a mechanism for the creation of dislocations must be activated in the material. Three mechanisms for dislocation formation are formed by homogeneous nucleation, by grain boundary initiation, and by the interface that occurs between the lattice and surface, precipitates, dispersed phases, and/or reinforcing fibers. The creation of a dislocation by homogeneous nucleation is a result of the rupture of the atomic bonds along a line in the lattice (e.g., heating the middle of a steel bar allows the bar to be bent at a location where the number of dislocations has been greatly multiplied). Further, a plane in the crystal lattice is sheared, resulting in two oppositely faced half planes or dislocations.

Interestingly, these dislocations can move away from each other through the lattice. Since homogeneous nucleation forms dislocations from perfect crystals and requires the simultaneous breaking of many bonds, the energy required for homogeneous nucleation is very high. For instance the stress required for homogeneous nucleation in copper has been shown to be $$\frac{\tau_{hom}}{G} = 7.4 \times 10^{-2}$$

where G is the shear modulus of copper (46 GPa). Solving for $\tau_{hom}$, we see that the required stress is 3.4 GPa, which is very close to the theoretical strength of the crystal. Therefore, in conventional deformation homogeneous, nucleation requires a very concentrated stress, and is normally unlikely to occur. Grain boundary initiation and interface interaction are more common sources of dislocations.

Irregularities at the grain boundaries in single crystal materials can produce dislocations, which propagate into the crystallite grain. The steps and ledges at the grain boundary are an important source of dislocations in the early stages of plastic deformation. Due to the small steps on the surface of most crystals, stress in certain regions on the surface is much larger than the average stress in the lattice; thus, the surface (i.e., surface tension) of a crystal can produce dislocations (single crystal growth in micro-gravity environments is currently being investigated).

Further, once produce, the dislocations can undergo propagation into the crystal lattice in the same manner as in 'grain boundary initiation'. In monocrystals, the majority of dislocations are formed at the surface. The dislocation density 200-μm into the surface of a material has been shown to be six times higher than the density in the bulk. However, in polycrystalline materials (e.g., such as steel) the surface sources cannot have a major effect, because most of the grains are not in contact with the surface.

Additionally, the interface that occurs between a metal and an oxide can greatly increase the number of dislocations created. The oxide layer puts the surface of the metal in tension because the oxygen atoms squeeze into the lattice, and the oxygen atoms are under compression. This greatly increases the stress on the surface of the metal and consequently the amount of dislocations formed at the surface. The increased amount of stress on the surface steps results in an increase of dislocations.

Until the 1930s, one of the enduring challenges of materials science was to explain plasticity in microscopic terms. A naive attempt to calculate the shear stress at, which neighbouring atomic planes slip over each other in a perfect crystal suggests that, for a material with shear modulus G, shear strength $\tau_m$ is given approximately by $$\tau_m = \frac{G}{2\pi}$$

As shear modulus in metals is typically within the range 20,000 to 150,000 MPa, this is difficult to reconcile with shear stresses in the range 0.5 to 10 MPa observed to produce plastic deformation in experiments. In 1934, Egon Orowan, Michael Polanyi and G. I. Taylor, roughly simultaneously, realized that plastic deformation could be explained in terms of the theory of dislocations. Dislocations can move if the atoms from one of the surrounding planes break their bonds and rebond with the atoms at the terminating edge. Even a simple model of the force required to move a dislocation shows that shear is possible at much lower stresses than in a perfect crystal. Hence, the characteristic malleability of metals.

When metals are subjected to 'cold working' (i.e., the deformation of material at temperatures, which are relatively low as compared to the material's absolute melting temperature $T_m$; i.e., typically less than $0.3\,T_m$) the dislocation density increases due to the formation of new dislocations and dislocation multiplication. The consequent increasing overlap between the strain fields of adjacent dislocations gradually increases the resistance to further dislocation motion. This causes a hardening of the metal as deformation progresses. This effect is known as strain hardening (sometimes called 'work hardening').

Tangles of dislocations are found at the early stage of deformation and appear as non well-defined boundaries; thus, the process of dynamic recovery leads eventually to the formation of a cellular structure containing boundaries with misorientation lower than 15° (i.e., low angle grain boundaries). The effects of strain hardening by accumulation of pinned dislocations and the grain structure formed at high strain can be removed by appropriate heat treatment (annealing), which promotes the recovery and subsequent recrystallisation of the material.

Dislocations can slip in planes containing both the dislocation and the Burgers Vector. For a screw dislocation, the dislocation and the Burgers vector are parallel, so the dislocation may slip in any plane containing the dislocation. For an edge dislocation, the dislocation and the Burgers vector are perpendicular, so there is only one plane in which the dislocation can slip. There is an alternative mechanism of dislocation motion, fundamentally different from slip, that allows an edge dislocation to move out of its slip plane, known as dislocation climb.

Dislocation climb allows an edge dislocation to move perpendicular to its slip plane. The driving force for dislocation climb is the movement of vacancies through a crystal lattice. If a vacancy moves next to the boundary of the extra half plane of atoms that forms an edge dislocation, the atom in the half plane closest to the vacancy can 'jump' and fill the vacancy. This atom shift 'moves' the vacancy in line with the half plane of atoms, causing a shift, or positive climb, of the dislocation. The process of a vacancy being absorbed at the boundary of a half plane of atoms, rather than created, is known as negative climb. Since dislocation climb results from individual atoms 'jumping' into vacancies, climb occurs in single atom diameter increments.

During positive climb, the crystal shrinks in the direction perpendicular to the extra half plane of atoms because atoms are being removed from the half plane. Since negative climb involves an addition of atoms to the half plane, the crystal grows in the direction perpendicular to the half plane. Therefore, compressive stress in the direction perpendicular to the half plane promotes positive climb, while tensile stress promotes negative climb. This is one main difference between slip and climb, since slip is caused by only shear stress. One additional difference between dislocation slip and climb is the temperature dependence. Climb occurs much more rapidly at high temperatures than low temperatures due to an increase in vacancy motion. Slip, on the other hand, has only a small dependence on temperature.

It should be obvious to the reader that crystallographic defects can be moved about, sometimes, even annihilated. The reason behind this movement lies in the fact that during high temperature crystallization, single crystal materials, such as Si, Ge, GaAs, InP, GaN, GaP, InAs, form crystallographic planes (i.e., being stacked plane upon plane) that are connected (i.e., one plane to another) via weak Van der Waal bonds. This explains why slipping occurs between these crystallographic planes.

However, when a single crystal material is treated with a temperature that ranges from 77K to 2.2K the weak Van der Waal bonds connecting its crystallographic planes become greatly condensed (i.e., shortened), thereby increasing bond energy to become bonds that exhibit the strength and behavior normally reserved for strongly covalent and/or ionic molecular bonds.

The molecules that normally comprise single crystal material have a bond structures that can be analogous to a pair of atoms connected by a spring (i.e., an molecular oscillator) that can acquire bond lengthening vibrational energy through collisions with other particles. Consequently, the length of any molecular bond depends upon the 'vibrational energy' present within the bond.

CONCLUSIONS, RAMIFICATIONS, AND SCOPE

The present invention provides for an inexpensive means to create semiconductor substrate wafers, semiconductor epilayers, semiconductor substrate boules, and other semiconductor structures that are larger, stronger, and altogether free from point, vacancy, dislocation, and other crystallographic defects.

I claim:

1. A method of cryogenically treating substrate wafers constructed from material taken from columns III-V of the periodic table, comprising:
   (a) lowering the temperature of a substrate wafer to cryogenic levels,
   (b) holding said temperature of said wafer at said cryogenic levels,
   (c) bringing the temperature of said wafer back up to room temperature,
   (d) elevating the temperature of said wafer to above ambient,
   (e) holding said temperature of said wafer for a period,
   (f) returning the temperature of said wafer to said room temperature,
   whereby the cryogenic treatment of said substrate wafers provides for the elimination of point, dislocation, vacancy, and other crystallographic defects from said substrate wafers.

* * * * *